United States Patent [19]

Tanno

[11] Patent Number: 4,510,435

[45] Date of Patent: Apr. 9, 1985

[54] APPARATUS FOR ELECTRICALLY TESTING MULTI-CORE CABLES

[75] Inventor: Shogo Tanno, Itami, Japan

[73] Assignee: Dainichi-Nippon Cables, Ltd., Hyogo, Japan

[21] Appl. No.: 409,551

[22] Filed: Aug. 19, 1982

[30] Foreign Application Priority Data

Sep. 2, 1981 [JP] Japan .................. 56-139009

[51] Int. Cl.³ .................. G01R 31/02; G01R 31/12
[52] U.S. Cl. .................. 324/52; 324/66; 324/73 R
[58] Field of Search .................. 324/51, 52, 54, 66, 324/73 R

[56] References Cited

U.S. PATENT DOCUMENTS

| | | | |
|---|---|---|---|
| 1,977,707 | 10/1934 | Weitzer | 324/73 R X |
| 3,473,112 | 10/1969 | Andrews | 324/66 X |
| 4,158,167 | 6/1979 | Tanno | 324/51 |
| 4,160,947 | 7/1979 | Tanno | 324/51 |

Primary Examiner—Stanley T. Krawczewicz
Assistant Examiner—Jose M. Solis
Attorney, Agent, or Firm—W. G. Fasse; D. H. Kane, Jr.

[57] ABSTRACT

An apparatus for electrically testing a multi-core cable comprises a pick-up unit (6) for picking up a core separately on a one by one basis from a group of cores (101) at one end of the cable (100). Conductor wires of all of a plurality of cores (101) of a cable are collectively rendered conductive by a contact grip (25, 25') at one end of all the conductor wires the opposite ends of which are immersed into a conductive liquid (41) in a vessel (39) at the other end of the cable. The conductor wire of the picked up core is electrically separated from the other cores and power is supplied to the picked up conductor wire so that a current flows through the picked up wire, the conductive liquid, the conductor wires of other cores and through the contact grip to ground. A determining circuit (300) determines in response to the current that the picked up core is in a discontinuity state when the current is smaller than a first value and that an insulation breakdown has occurred between the picked up core and any other core of the cable when the current is larger than a second value which larger than the first value. Thus, both a discontinuity test and a defective insulation test are carried out simultaneously by the present apparatus.

12 Claims, 7 Drawing Figures

APPARATUS FOR ELECTRICALLY TESTING MULTI-CORE CABLES

BACKGROUND OF THE INVENTION

1. Field of the Invention

This invention relates to an apparatus for electrically testing multi-core cables and more particularly it relates to a discontinuity test and a defective contact test of the cores of a multi-core cable, such as a communication cable, having a number of cores, each comprising a conductor wire and an insulating cover. Such testing involves automatically separating the cores one by one.

2. Description of the Prior Art

Usually, a communication cable is constructed by using as a structural unit a pair of said cores twisted together or a quad in which four cores are twisted together. Some local communication cables containing a number of cable circuits comprise as many as 2,400 to 3,200 pairs, i.e., 4000 to 6400 cores may be contained in a single cable. In the production of such communication cables, all of these cores have to be tested individually, one by one, to see if there is a defective contact due to an insulation breakdown or a discontinuity. Such testing takes place in an intermediate or final stage of cable production in order to guarantee the quality of each cable. In order to carry out such tests, the inventors of this invention have already proposed an apparatus for testing defective contacts in the cores of a multi-core cable as disclosed in U.S. Pat. No. 4,160,947 and an apparatus for discontinuity testing the cores of a multi-core cable as disclosed in U.S. Pat. No. 4,158,167.

The electrical testing devices for a multi-core cable as described in said two U.S. Patents have greatly reduced the enormous amount of time and labor that was required to connect each core one by one to a measuring terminal with a multi-pole connector. An automatic and efficient defective contact testing and discontinuity testing were realized by the use of each apparatus for these tests. However, there is room for improvement in each of the devices described in said U.S. Patents.

In using the above mentioned apparatus for a discontinuity test of a multi-core cable, the test is carried out by collectively holding the cores at one end in mutually isolated relation, while collectively rendering them conductive at the other end, and picking up a single core one by one from the group of cores at one end. On the other hand, in using the above proposed apparatus for a defective contact test, the test is carried out by collectively rendering the core at one end conductive while holding them in mutually isolated relation at the other end and picking up a single core one by one from the group of cores at one end. As a result, the way to connect the conductor of the group of cores at both ends of a cable in the discontinuity test is converse to that in the defective contact test. In addition, each electrical test is carried out by different methods, in which different steps must be taken separately by each tester for the defective contact test and for the discontinuity test even using the above mentioned efficient apparatuses.

SUMMARY OF THE INVENTION

An object of this invention is to provide an automatic electric testing apparatus by which both the defective contact test and the discontinuity test of the cores of a multi-core cable are simultaneously and efficiently conducted.

Another object of this invention is to provide a compact electric testing apparatus for both the defective contact test and the discontinuity test of the cores of a multi-core cable.

A further obect of this invention is to provide an electric testing apparatus which makes it possible to detect whether or not there is a defective contact or a discontinuity in any one core of a group of cores while conducting automatically and successively both the defective contact test and the discontinuity test.

These objects have been achieved by an electric testing apparatus which comprises first connecting means for collectively rendering conductive the conductor wires of all the cores of the multi-core cable at one end, second connecting means for collectively rendering conductive through a predetermined value of electrical resistance, the conductor wires of all the cores of the multi-core cable at the other end, core pick-up and transferring means mounted at the one end of the multi-core cable for picking up a core separately one by one from a group of cores and transferring the same, separating means for electrically separating a core picked up and transferred by the core pick-up and transferring means from the first connecting means, pick-up detecting means for detecting whether or not a core is picked up and transferred by the pick-up and transferring means, electricity supply means for supplying electricity to the conductor of the separated picked up core so that current may flow through the second connecting means, and detecting means for detecting whether or not any discontinuity or any defective contact is present in the picked up core based on the current flowing through the conductor wire of said picked up core.

According to the invention, once a multi-core cable is set up or prepared for testing, the defective contact test and the discontinuity test can be conducted automatically using a single apparatus. As a result each of the cores can be tested successively one by one more efficiently than is conventionally the case by using two different testers for the defective contact test and for the discontinuity test.

These objects and other objects, features, advantages and aspects of the present invention will become more apparent from the following detailed description of the invention made with reference to the accompanying drawings.

DESCRIPTION OF PREFERRED EMBODIMENTS AND OF THE BEST MODE OF THE INVENTION

In the drawings, like reference characters indicate like or corresponding parts.

Figure 1:
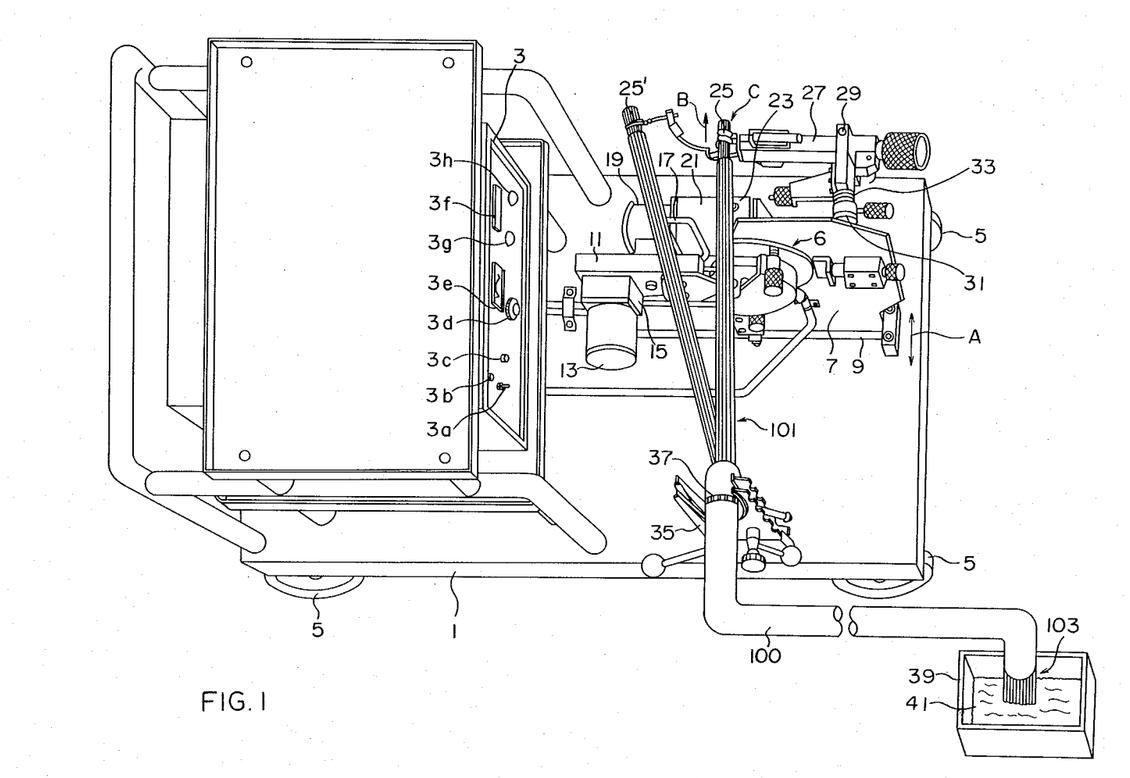
FIG. 1 is a complete perspective view showing an embodiment of the present invention.

FIG. 1 is a complete perspective view from above onto the apparatus of the invention. A table 1 has a power source unit 3 enclosed in a box mounted thereon, and casters 5 are attached to the lower surface of the table 1 to render it movable. Mounted on the front of the power source unit 3 in the illustrated disposition are a power switch 3a, for turning on or off the power, a pilot lamp PL1 for indicating the power being turned on, a buzzer 3d for reporting an abnormal core detection to the operator and a reset switch 3c for stopping the sound of the buzzer.

Further, mounted on the front of the power source unit 3 are a voltameter 3e for indicating the power source voltage for testing, a counter 3f for counting and indicating the number of tested cores picked up by a core pick-up unit 6 which will be described in more detail below, and further, a pilot lamp 3g for reporting the detection of a discontinuity and a pilot lamp 3h for reporting the detection of a defective contact.

A support plate 7 for mounting the core pick-up unit 6 is pivotally mounted on the upper surface of the table 1 by a shaft 9 for pivoting the plate 7 about the shaft 9 as indicated by the arrow A. Mounted on one section of the support plate 7 is a block 11 for supporting a pick-up motor 13 and a speed reducer 15 which is attached to the motor 13 and is adapted to be swung or tilted in the direction of arrow A together with the support plate 7.

One end of a rod 17 for separating a group of untested cores from a group of cores being tested, which are included in the group of cores 101 at one end of a cable 100 brought to the pick-up unit 6, is attached to the end of one section of the block 11.

Disposed on the other side of the support plate 7 is a swinging or tilting mechanism comprising a motor 19, a speed reducer 21 and a bearing clock 23. This swinging or tilting mechanism serves to periodically tilt the support plate 7 in the direction of arrow A when the motor 19 is energized. The details of this tilting mechanism are the same as those disclosed in U.S. Pat. No. 4,160,947.

Each conductor wire of the group of cores is gripped by a grip arm 25 and the cores are bound together by a binding wire 25' whereby the cores are collectively rendered conductive. This grip arm 25 is attached to an arm 27, which is pivotally mounted on the other side of the support plate 7 by a mounting member 29 and a shaft 31. Disposed at the left end of the arm 27 is, a coil spring (not shown) whereby the arm 27 and substantially the grip arm 25 is twisted in the direction of arrow B. Mounted on the upper part of the arm 27 a coil spring 33 for twisting the arm 27 in the direction of arrow C. By the twisting forces in the directions indicated by the arrows B and C the group at cores 101 of one end of the cable 100 is pressed against the pick-up unit 6 for picking them up with more certainty.

Further, located above the upper surface of the Table 1 is a bracket 35 having a U-shaped opening for gripping the cable 100 by its sheath near its one end. A wire rope 37 cooperates with the bracket 35 for holding the cable 100 in place.

The group of cores of the other core end 103 of the cable 100 is collectively immersed in water 41 which is stored in a vessel 39 and acts as a fluid electrode. Therefore, each conductor of the group of the other core end 103 is mutually connected through a predetermined electrical resistance which depends on the specific electrical resistance of the water 41. Furthermore, since each conductor of one core end 101 is, as explained above, collectively gripped by the grip arm 25 and the binding wire 25', the value of electrical resistance between the conductor amounts to almost naught.

Figures 2A, 2B:
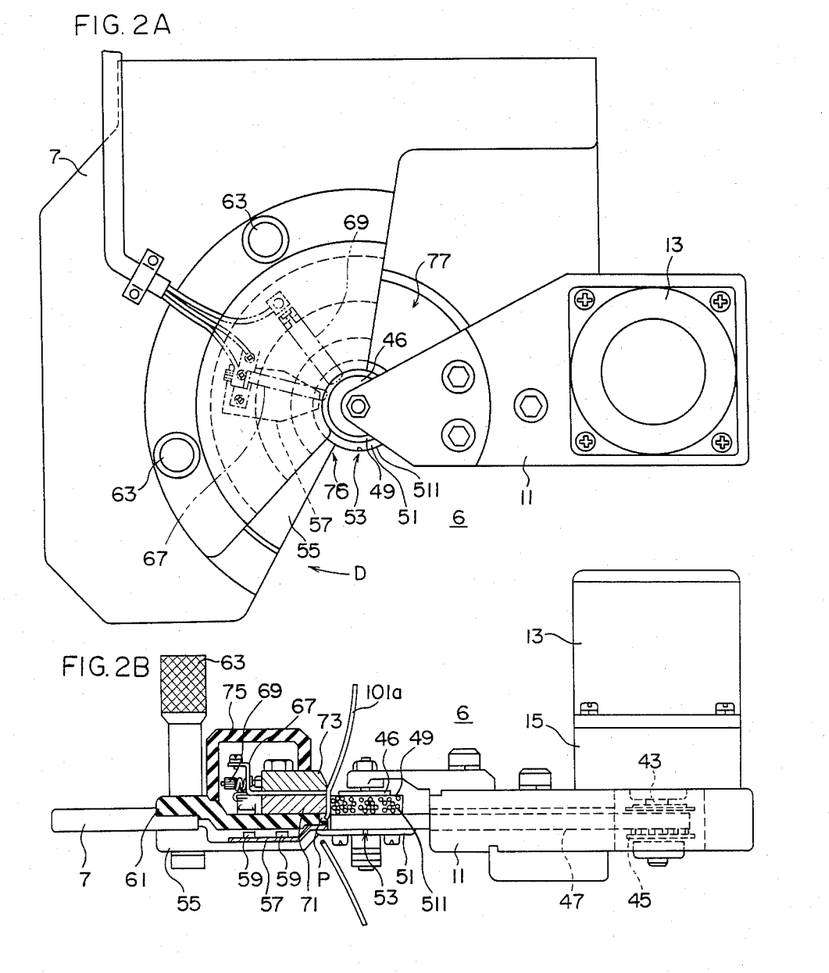
FIGS. 2A and 2B are diagrammatic views showing in detail a pick-up unit of the present apparatus.

Next, the principal portions of the pick-up unit 6 in this embodiment will be described in more detail with reference to FIGS. 2A and 2B. The block 11 is mounted on one section of the support plate 7, as described above. The pick-up drive motor 13 is mounted through the speed reducer 15 which is mounted to one side of the block 11. A power shaft 43 of the speed reducer 15 passes through a hole in the block 11 and a timing drive pulley 45 is mounted on the power shaft 43.

A disc 51 for driving a rubber roller 49 is mounted for cooperation with the timing drive pulley 45. A timing drive belt 47 interconnects the pulley 45 and the disc 51 is attached to the rubber roller 49. Therefore, the rubber roller 49 and the disc 51 rotate when the motor 13 is energized. The disc 51 has one or more than two notches 53 formed around its peripheral side face, each notch having a width and a depth sufficient for taking in a core. The peripheral surface of the rubber roller 49 has concavities and projections to provide a rough surface 511 for entraining individual cores 101a at one end of the cable 100 as the cores 101a are pressed against the roller 49 by the mechanism. In accordance with the rotation of the disc 51, each 101a is picked up into the notches 53 one by one from the group of cores 101 at one end of the cable 100 (shown in FIG. 1) whereby the cores are transferred in the rotating direction of the disc 51. Further, for temporarily holding a picked up core being transferred, by confining it perfectly in its notch 53 the other side of said support plate 7 is provided with a lid-like member, i.e., a block 55 having a front end disposed adjacent to the periphery of the rotary disc 51 with a small clearance therebetween. The block 55 carries a cutter 57 fixed by screws 59. The cutter 57 cuts and electrically separates a core picked up by the rotary disc 51 from the group of cores 101 which is collectively held at one end of the cable.

The upper surface of the cutter 57 is covered with an insulating cover 61 attached to one side of the support plate 7. The front end of the cover 61 is located at substantially the same position as the tip of the cutter 57 and a step-like clearance P is defined in the upper portion of the cover 61. Therefore, the front cut end of a core 101a cut by the cutter 57 is confined in this clearance P and electrically isolated from the other cores as it is further transferred in accordance with the rotation of the rubber roller 49 for making an electrical test described below. This insulating cover 61 is attached to the support plate 7 by attaching screws 63. On the upper surface of the insulating cover 61, a pick-up detecting electrode 67 and a power supply electrode 69 are disposed as indicated in FIG. 2A. The pick-up detecting electrode 67 detects that a core 101a is certainly picked up and transferred by contacting the core 101a which has been picked up by the notch 53 in the disc 51 and transferred by the rubber roller 49. Further, the detected pick-up signals from electrode 69 are counted to determine the number of tested cores and also has a function for setting up time for a determination whether or not there is any discontinuity or defective contact in a picked-up core subjected to the discontinuity test and to the defective contact test which are described below. The power supply electrode 69 supplies a voltage for testing, to be described below, to the conductor wire of a core 101a as it is being transferred. The pick-up detecting electrode 67 and the power supply electrode 69 are, preferably, put between covers 71 and 73 which are partly enclosed by an insulating cover 75 and the insulating cover 61. The power supply electrode 69 is a bladed electrode disposed so that there is a slight clearance between its tip and the peripheral surface of the rubber roller 49. The pick-up detecting electrode 67 and the power supply electrode 69 are, though not shown, positioned for adjustment in the direction of their length. Further, the peripheral surface of the rubber roller 49 is not only composed of a rough face but may comprise notches at optional distances from each other for positively entraining a core 101a.

The first end of a transferring path of a core 101a is defined as the core charging part 76 and the other end of the transferring path of a core 101a is defined as the core discharging part 77. Moreover, in the pick-up unit of this testing apparatus, at the other end of the cable the conductors of each core are collectively rendered conductive. Therefore, and since the electric charge, which is applied to a picked up core 101a by the power supply electrode 69, is rapidly discharged after the conclusion of the tests, there is not need for a bladed discharge electrode in order to assure the required safety. Hence, the apparatus can be made compact.

Figure 3:
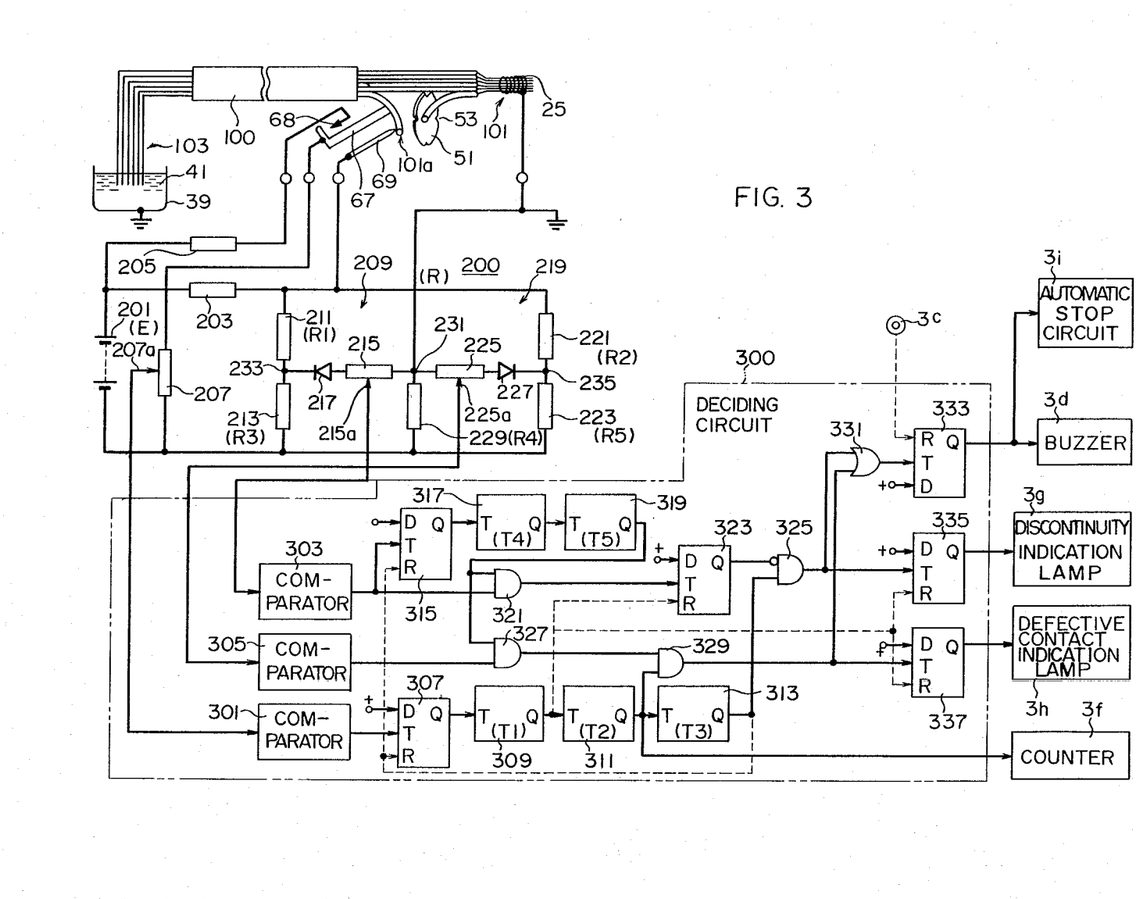
FIG. 3 is an electric circuit diagram of the present apparatus.

As shown in FIG. 3 of an electric circuit diagram of an embodiment of the invention, all conductor wires of the group of cores at one end 101 of a multi-core cable 100, which are collectively held by a grip arm 25 and a binding wire 25', are also grounded.

The other end 103 is immersed in a fluid electrode such as, water 41. Besides the vessel 39 is preferably made of conductive material and also grounded. The bladed power supply electrode 69 is connected to a testing power source such as a battery 201 through a current limiting resistor 203. The pick-up detecting electrode 67 cooperating with a contact point 68 constitutes a normally closed switch for detecting the pick-up of a core. Though a normally opened switch may be employed for this switch for detecting a pick-up, a normally closed switch makes the detection easier without being affected by the diameter of the insulated cores. The contact point 68 is connected to the power source 201 through a resistor 205 and the detecting pick-up electrode 67 is connected to the minus side of the power source 201, namely grounded through a potentiometer 207. Two parallel resistance circuits forming bridge sections 209 and 219 of a double bridge 200 are connected to the power source 201 through the current limiting resistor 203. The bridge section 209 comprises in three bridge arms resistors 211, 213 and 229, and in the fourth bridge arm a resistor (R) (to be described in detail below) provided by the cable 100, namely substantially by a picked up core 101a. Thus, in this embodiment the variation or double bridge circuit 200 has two bridge circuits 209 and 219 which share common bridge arms.

A series circuit comprising a potentiometer 215 and a diode 217 forms a first current path between connecting points 231 and 233 of bridge circuit 209. The bridge circuit 219 comprises in three bridge arms resistors 221, 223 and 229, and in the fourth bridge arm the resistor (R) provided by the core 101a also present in one arm of the other circuit 209. Connected between the connecting points 231 and 235 of bridge circuit 219 is a further series circuit comprising a potentiometer 225 and a diode 227 forming a second current path. The bridge circuit 209 detects whether or not there is any break or discontinuity in a core 101a and the bridge circuit 219 detects whether or not there is any defective contact of a core 101a with other cores which would show a defective insulation.

In testing, first the sheath is removed from both ends of a multi-core cable 100 wound on a reel (not shown) to take out the groups of core ends 101 and 103. Then the conductor wires of the group of cores the near end 101 are collectively held by the grip arm 25 and the binding wire 25' and the group of cores at the other end 103 is immersed in the electrically conductive fluid electrode, such as water 41. Then the group of one core end 101 is brought into the core charging device 76 of the pick-up unit 6 (see FIG. 2A) and pressed against the peripheral surface of the disc 51 which is rotated by energizing the motor 13, whereby one core 101a at a time is picked up and transferred by a core picking up notch 53 on the disc 51. Thereafter, this picked up core 101a is cut by the cutter 57 mounted along the transferring path (see FIGS. 2A and 2B) whereby it is separated electrically from the group of cores at one end collectively held and rendered conductive. That is to say, the conductor of the picked up core 101a is electrically isolated from other cores held by the grip arm 25 the binding wire 25' at the end. Thus, in accordance with the transfer of the electrically isolated core 101a, the core is brought into contact with the tip of the detecting pick-up electrode 67. As the transfer continues the picked up core 101a reaches the blade of the power supply electrode 69 which pierces the insulating cover on the core 101a until it contacts the conductor wire. As a result, a certain voltage (E) is applied to the conductor wire of the picked up core 101a from the power source 201. Accordingly, an electric current flows from the power source 201—the current limiting resistor 203—the electrode 69—the conductor of core 101a—the fluid electrode or water 41 at the other end—other cores—ground. (R) is an equivalent resistance value of this current route. (R1), (R2), (R3), (R4) and (R5) respectively represent the values of the resistors 211, 221, 213, 229 and 223. In this embodiment R3 equals R4 equals R5. Additionally, as the resistance values of the potentiometers 215 and 225 are much higher than R5, the two bridge circuit sections 209 and 219 function independently of each other. Further, in an electric double bridge circuit 200, the values of the resistors 211 and 221, (R1) and (R2) are already set to satisfy the relationship $R1 > R > R2$ when the picked up core 101a is normal.

A deciding circuit 300 comprises three comparators 301, 303 and 305. Connected to the input of the comparator 301 is a terminal 207a of the potentiometer 207. Connected to the input of the comparator 303 is a terminal 215a of the potentiometer 215 in the bridge circuit section 209. Connected to the input to the comparator 305 is a terminal 225a of the potentiometer 225 in the bridge circuit section 219. The comparators 301, 303 and 305 discriminate a voltage level which is taken from the corresponding potentiometer at a certain value of a threshold level. Connected to the trigger input (T) of a D-type flip-flop 307 (hereinafter described as "flip-flop 307") is the output from the comparator 301. The data input (D) of the flip-flop 307 is connected to the high level (+). The trigger input (T) of a retriggerable monostable multivibrator 309 is connected to the output (Q) from the flip-flop 307. The monostable multivibrator 309 is triggered by the rising edge of the output (Q) from the flip-flop 307 and delivers the output (Q) at the high level for a certain time (T1), for example one millisecond, for removing an influence of a chattering phenomenon. The output from the monostable multivibrator 309 is applied to the trigger input of a monostable multivibrator 311 which delivers the output at the high level for a comparatively long time (T2), for example 60 or 70 milliseconds, in response to the falling edge of the output from the monostable multivibrator 309. The output duration time (T2) of the monostable multivibrator 311 is set in the period when the picked up core 101a is confined and transferred by the rotary disc 51 and the rubber roller 49 (see FIG. 2). The time (T2) determines the period for testing or deciding. Connected to the trigger input of a monostable multivibrator 313 is the output from the monostable multivibrator 311, which is triggered in response to the falling edge of output from the monostable multivibrator 311 and delivers the output at the high level for a certain time (T3), for example one millisecond. The output from the monostable multivibrator 311 is additionally supplied to the first input of a 2-input AND gate 329 and to the counting input to a counter 3f. Further, the output from the monostable multivibrator 313 is supplied to the first input to a 2-input AND gate 325.

The output from the comparator 303 is supplied to the trigger input of a flip-flop 315 and to the first input of a 2-input AND gate 321. The data input (D) of the flip-flow 315 is connected to a suitably high level. The trigger input of a monostable multivibrator 317 is connected to the output from the flip-flop 315. This monostable multivibrator 317 is triggered in response to the rising edge of the output from the flip-flop 315 and delivers the output at the high level for a certain time (T4), for example, 5 milliseconds. The output from the monostable multivibrator 317 is supplied to the trigger input of a monostable multivibrator 319 which is triggered in response to the falling edge of the output from the monostable multivibrator 317 and delivers such output for a certain time (T5), for example, one millisecond. The output from the monostable multivibrator 319 is supplied to the second input of the 2-input AND gate 321 and to the first input of the 2-input AND gate 327. The monostable multivibrator 317 prevents an erroneous decision of the tester if the multi-core cable to be tested is too long. That is to say, if the multi-core cable is short enough and if the picked up core 101a is discontinuous or interrupted, the electric current supplied by the power supply electrode 69 hardly flows and an input cannot be delivered by the comparator 303 and 305. However, if the multi-core cable is too long for the test, even if the picked up core 101a is discontinuous, the electric current flows in a moment and the input is delivered at the high level from the comparator 303 (and 305). The monostable multivibrator 317 is set to invalidate the output delivered at the high level in a moment from the comparator 303 (and 305).

The output from the AND gate 321 is supplied to the trigger input of a flip-flop 323. The data input of the flip-flop 323 is connected at a suitable high level (+) and the output thereof is inverted and supplied to the second input of the 2-input AND gate 325.

Further, the output from the comparator 305 is supplied to the second input to the 2-input AND gate 327. The output of the AND gate 327 is given to the second input to the 2-input AND gate 329. The outputs from AND gate 325 and 329 are respectively supplied to the input of an OR gate 331. The output from the OR gate 331 is supplied to the trigger input of a flip-flop 333. The output from the AND gate 325 is also supplied to the trigger input to a flip-flop 335 and the output from the AND gate 329 is supplied to the trigger input of a flip-flop 337. Each data input to the flip-flops 333, 335 and 337 is connected at a suitable high level. The output from the flip-flop 33 is supplied to the driving input of a buzzer 3d as well as to an automatic stop circuit 3i as a stop signal. The output from the flip-flop 335 is supplied to the driving input of a discontinuity indication lamp 3g and the output from the flip-flop 337 is supplied to the driving input of a defective contact indication lamp 3h.

The output from the monostable multivibrator 313 is supplied to the reset input (R) to the flip-flops 307 and 315 as shown by a dashed line in FIG. 3. The output from the monostable multivibrator 309 is also supplied to the reset input of each of the flip-flops 323, 335 and 337 as shown by a dashed line in FIG. 3. A reset signal from a reset switch 3c is supplied to the reset input of the flip-flop 333. The operation of this embodiment constructed in the manner described above will be now described with reference to FIG. 4.

Figure 4:
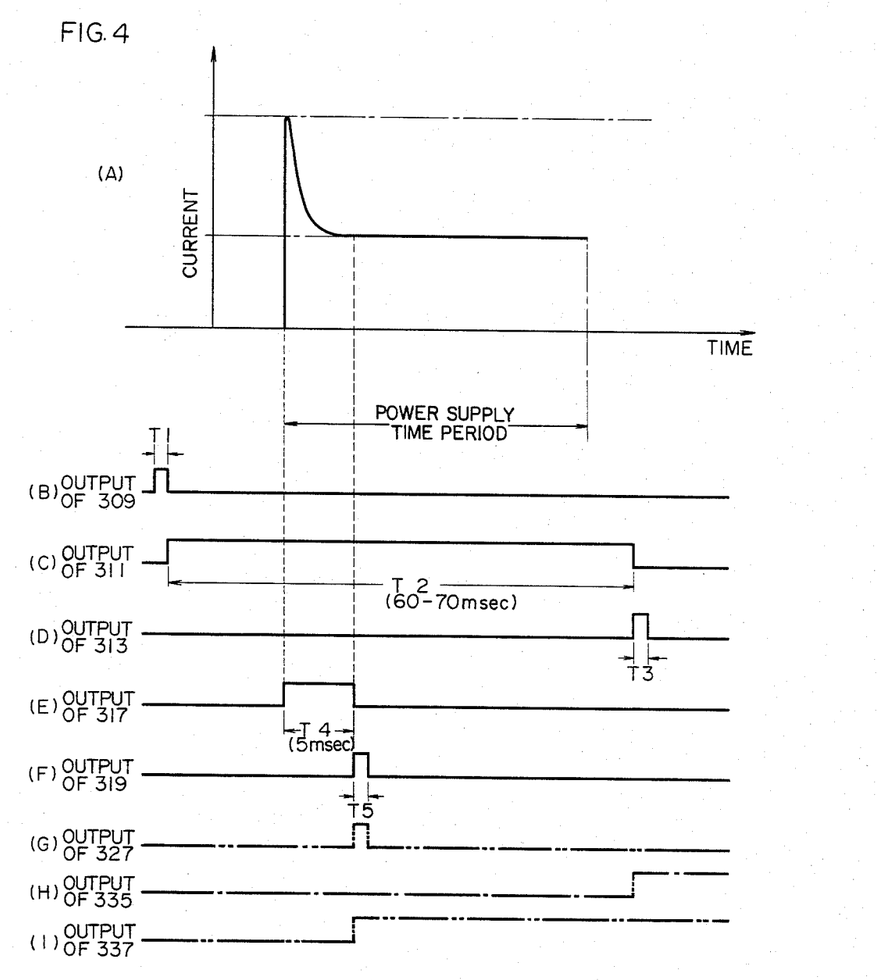
FIG. 4 is a timechart for the explanation of the operation of the electric circuit shown in FIG. 3.

In FIG. 4, waveform (A) indicates the electric current which flows through a picked up core 101a, and waveform (B), (C), (D), (E) and (F) respectively indicate the inputs to the monostable multivibrators 309, 311, 313 317 and 319. Waveform (G) indicates the output from the AND gate 327 in case of defective contact, waveform (H) indicates the output from the flip-flop 335 in case of a discontinuity, and waveform (I) indicates the output from the flip-flop 337 in case of a defective contact.

In the operation of the embodiment shown in FIG. 3, when the power source 201 has been turned on for testing, the electric current flows through the power source 201—a resistor 205—a contact point 68—a pick-up detecting electrode 67—and a potentiometer 207. The potentiometer terminal 207a provides a voltage proportional to flowing current, and such voltage is applied to an input of the comparator 301. The output of the comparator 301 is at the low level because it outputs at the high level when the input voltage is lower than a certain value of threshold level.

Further, when a core 101a is picked up and transferred, the pick-up detecting electrode 67 is pushed to separate its electrical contact with the contact point 68. Subsequently the electric currect which is flowing through the potentiometer 207 also is interrupted and the input to the comparator 301 lowers less than a certain value of threshold level. Consequently, the output from this circuit 301 grows to the high level and, in response to the rising edge of this output from 301, the flip-flop 307 is triggered. As a result, at this time, the output from the flip-flop 307 rises to the high level to get such output as indicated in FIGS. 4 (B), (C) and (D) from the monostable multivibrators 309, 311 and 313. In accordance with the output from the monostable multivibrator 311, a counter 3f starts a counting action for counting the number of picked up cores and for indicating the count.

Thereafter, a picked up core 101a is transferred along its transferring path and its insulating cover is cut by the blade of the power supply electrode 69, which contacts the conductor wire of the picked up core. As a result, a current path is provided from the power source 201 through the group of cores 101 at one end connected to the grip arm 25 and held together by the binding wire 25' and a current flows as indicated in FIG. 4 at waveform (A). At the time when power is supplied to the picked up core, a peak current flows for a moment because of the electrostatic capacity of between the picked up core and other cores of the group. However, the peak current is quickly reduced to a predetermined value determined by the resistor 203 and a composite resistance (RO) composed of two bridge circuits 209 and 219 comprising the above described resistor R. On the other hand, the electric potential at the connecting points 233 and 235 fluctuates about to the reference electric potential at the connecting point 231 which is zero. If the value of the resistor R comprising the core is less than the value R1 of the resistor 211, the electric potential at the connecting point 233 becomes minus and the current flows through the potentiometer 215. Further, if the value of said resistor R is less than the value R2 of the resistor 221, the electric potential at both connecting points 223 but 235 becomes minus and consequently a current flows even through the pontentiometer 225.

First, the case where the picked up core is normal will be explained. In response to the power supply through the electrode 69, a current flows from the connecting point 231 to the connecting point 233 of the bridge circuit 209. This current is converted into a voltage by the potentiometer 215 and supplied to the comparator 303. Substantially, the output from the comparator 303 rises to the high level and also the flip-flop 315 outputs at the high level. In response to the rising edge of the output from the flip-flop 315, the monostable multivibrator 317 and then the monostable multivibrator 319 are successively triggered and the output is shown by the waveforms (E) and (F) in FIG. 4 respectively. Therefore, in accordance with the output from the monostable multivibrator 319, the AND gate 321 outputs at the high level and triggers the flip-flop 323 which provides a high level output. The high level output from the flip-flop 323 is inverted and supplied to the AND gate 325. Consequently the AND gate 325 outputs at the low level at a time when the output from the monostable multivibrator 313 is obtained. As a result, none of the flip-flops 333, 335 or 337 is triggered. Thus, in case that the picked up core is normal, only the counter 3f operates to count the number of the cores.

Next the case where the picked up core 101a is discontinuous or interrupted will be explained. In this case, a current does not flow through the potentiometers 215 and hence 225 and the outputs from the comparators 305 and 303 remain at the low level and so do the outputs from the AND gates 321, 327 and 329. Therefore, the flip-flops 323 and 337 are not triggered. The output from the flip-flop 323, remaining at the low level, is inverted and supplied to the AND gate 325. On the other hand, when a pulse indicated by waveform (D) in FIG. 4 from the monostable multivibrator 313 is obtained, the AND gate 325 outputs at the high level. Therefore, at this point, the flip-flops 333 and 335 are triggered and provide a high level output as indicated in FIG. 4 by waveform (H). As a result, both the buzzer 3d and the discontinuity indication lamp 3g are energized and inform the operator of the detection of a discontinuous core. Additionally, in accordance with the output from the flip-flop 333, an automatic stop circuit 3i operates to stop the motor 13 (see FIG. 2A) and to interrupt the testing thereby providing information that the picked up core is discontinuous.

Next, the case where a picked up core 101a has an insulation break down, namely, a so-called defective contact with other cores, will be explained. In this case, as explained above, the current flows through both bridge circuits 209 and 219, and both potentiometers 215 and 225 detect a voltage. Accordingly, both comparators 305 and 303 deliver high level outputs. Therefore, in accordance with the waveform (F) indicated in FIG. 4, the AND gates 321 and 327 provide a high level output. Consequently the flip-flop 323 is triggered as described above. On the other hand, as the output is delivered at the high level for a comparatively long time from the monostable multivibrator 311 as indicated by waveform (C) in FIG. 4, the AND gate 329 also provides a high level output. Further, the AND gate 325 outputs at the low level, since the flip-flop 323 outputs at the high level. Therefore, at this time, the flip-flops 333 and 337 are triggered to provide a high level output as indicated waveform (I) in FIG. 4. Accordingly, the buzzer 3d and the defective contact indication lamp 3h are energized and, in addition the automatic stop circuit 3i is operated to indicate to the operator that the picked up core 101a has an insulation break-down. The automatic stop circuit 3i interrupts the test and an indication is provided that the picked up core has a defective contact with other cores.

Figure 5:
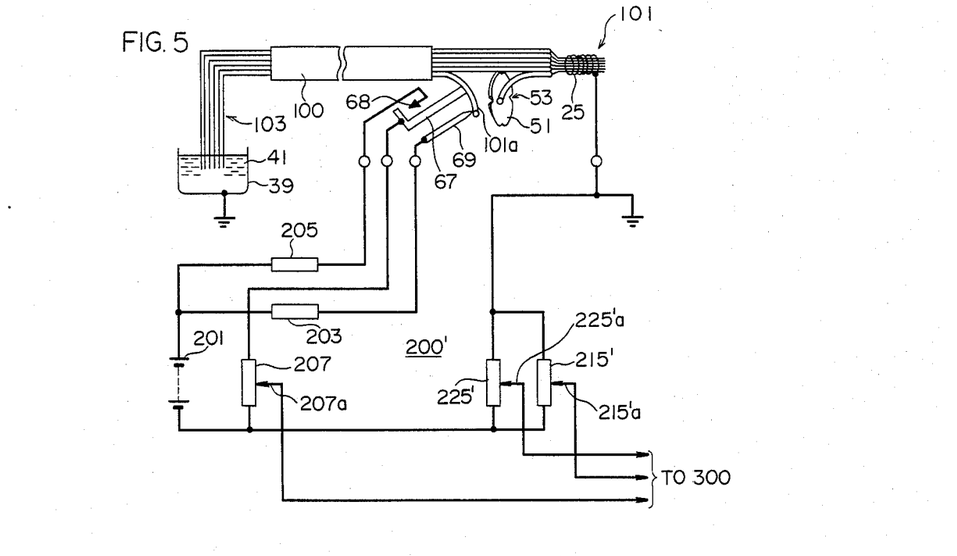
FIGS. 5 and 6 are electric circuit diagrams respectively showing different further embodiments of the present invention.

FIG. 5 is an electric diagram showing another embodiment of this invention. This embodiment differs from the embodiment described in FIG. 3 especially in the current circuit, 200' but and the deciding circuit 300 is the same as that of the embodiment of FIG. 3. In the embodiment shown in FIG. 5 and another embodiment described in FIG. 6 later, a detailed explanation of what is equivalent to that described in FIG. 3 is omitted here by using the same or similar reference numbers for items already described above. In the embodiment described in FIG. 5, potentiometers 215' and 225' forming a detecting circuit 200' are employed for a direct detection instead of the two bridge circuits 209, 219 forming the circuit 200 in FIG. 3. Voltages detected by the potentiometers 207, 215' and 225' are supplied to the comparators 301, 303 and 305, respectively (see FIG. 3). As for the operation of the embodiment described in FIG. 5, it will be understood easily without a detailed explanation.

Figure 6:
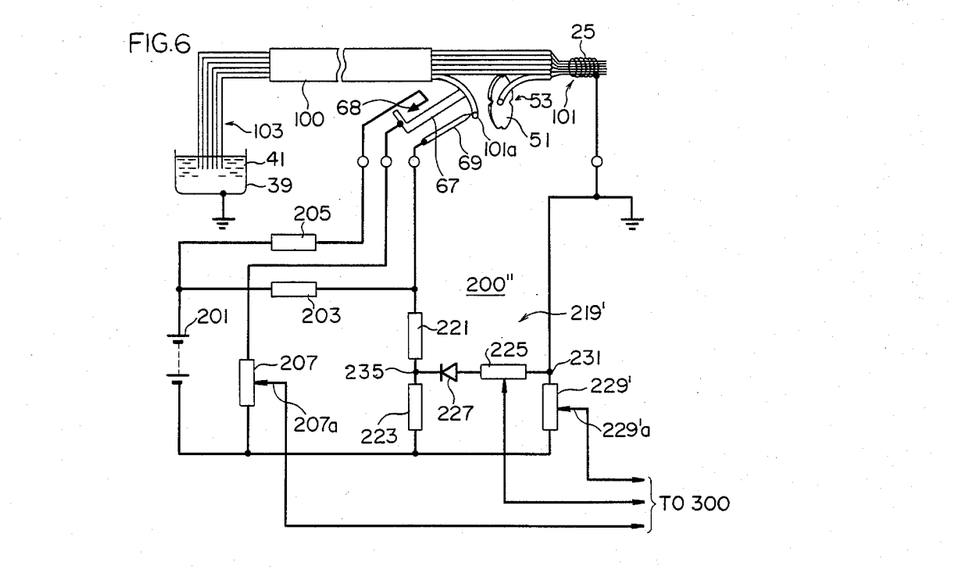

Another embodiment shown in FIG. 6 comprises a bridge circuit 219' forming as a detecting circuit 200". Connected to one arm of the bridge circuit 219' is a potentiometer 229'. Further, in the embodiment, shown in FIG. 6 also, voltages detected by the potentiometers 207, 225 and 229' are supplied as inputs to the comparators 301, 305 and 303, respectively. Again a detailed explanation on the operation of FIG. 6 will be unnecessary.

Moreover, in all the embodiments described described with reference to FIGS. 3, 5 and 6, the water vessel 39 is made of a conductive material and is grounded. Grounding the vessel 39 of conductive material enables testing even the last core, because, when the last core is picked up, the current path is not formed and consequently the last core is detected to be discontinuous unless the vessel 39 is grounded.

Moreover, both the current circuits 200' and 200" and the deciding circuit 300 in the above described embodiments are only examples and should not be interpreted by way of limitations of the circuit construction, because there can be several other variations of the current detecting circuits as well as of each component in the deciding circuit 300.

Further, the disposition of the cutter 57, the pick-up detecting electrode 67 and the power supply electrode 69 in the pick-up unit of cores should not be defined as limited to the above described embodiments but be optional provided the power supply electrode 69 is arranged to contact the picked up core after it is electrically isolated from the other end of a cable by the cutter 57. For example, any one of the following current path is possible from the pick-up detecting electrode 67—the cutter 57—to the power supply electrode 69, or from the cutter 57—the pick-up detecting electrode 67—to the power supply electrode 69, or from the cutter 57—the electricity charging electrode 69—to the pick-up detecting electrodes 67.

Further, the grip arm 25 and the binding wire 25' are employed as the first connecting means. However, the first connecting means as well as the second connecting means may comprise a vessel for storing conductive liquid to form a conductive liquid or fluid electrode. In such a case, the conductive fluid forming the first connecting means has preferably a lower specific resistance than that of the second connecting means because differences can be found in the resistance values between each core in a conductive fluid as the first connecting means and the second connecting means or between the cores and ground in the discontinuity and defective contact test. For example, if ordinary water is used as the conductive fluid for the second connecting means the lower specific resistance of the first connecting means may be achieved by using salt water for the first connecting means. Other chloride, electrolytic solution comprising alkali or acid, paste-like substances or colloidal solutions having an electrolysis character or metal having low melting point and which is held molten by heating with a heater, may be used to form the first connecting means. Further, instead of obtaining a core pick-up signal by means of a core a pick-up detecting electrode 67, which is constructed to open or close mechanically by the arrival of a core, other means may be used for obtaining such signal. For example, a projector and a receiver such as a light emitting diode and a phototransistor may be arranged to face each other across a core transferring path. Yet another possibility senses the approaching and passing of a core by mounting a proximity switch adjacent the transferring path of a core. Such proximity switch is operated by the approach of a conductor wire.

Further, instead of using a rotary disc with notches for the core transfer, an endless belt with notches or a reciprocating board with notches, or other suitable means may be used for picking up and transferring a core.

As described in detail above, according to this invention the electric testing apparatus for testing multi-core cables, such as communication cables having a number of cores, detects efficiently and with certainty whether or not there is a defective contact or a discontinuity in any one of the cores of the cable by automatically separating the cores one by one. The time required for such testing heretofore and any troubles encountered heretofore in such testing have been substantially reduced. The present apparatus is very useful for assuring a quality control of any multi-core cable.

Although the present invention has been described and illustrated in detail, it is to be understood that the same is by way of illustration and example only and is not to be taken by way of limitation, the spirit and scope of the present invention being limited only by the terms of the appended claims.

What is claimed is:

1. An apparatus for electrically testing a multi-core cable (100) for different types of defects, said multi-core cable including a plurality of cores each core having a conductor wire and an insulation covering said conductor wire, comprising:

first connecting means (25, 25') for collectively rendering conductive said conductor wires of all of a plurality of cores of said multi-core cable at one end thereof, second connecting means (41) providing a current flow path for collectively rendering conductive said conductor wires of all of said plurality of cores of said multi-core cable at the other end thereof, resistance means operatively coupled to said second connecting means for providing a predetermined resistance value in said current flow path for causing a change in the magnitude of a current flowing through said current flow path in response to different defects in the respective core, core pick-up and transferring means (6) mounted at said one end of said multi-core cable for picking up cores separately on a one by one basis and for transferring a picked up core, separating means (57) for electrically separating the core picked up and transferred by said core pick-up and transferring means, from said first connecting means, pick-up detecting means (67, 68, 207, 301) for detecting whether a core is picked up and transferred by said pick-up and transferring means, power supply means (69, 201) for supplying electricity to the conductor wire of said electrically separated picked up core so that a current of different magnitude may flow through the conductor wire of said picked up core, through said predetermined value resistance means operatively coupled to said second connecting means, through conductor wires of other cores, and through said first connecting means for enabling detection of different defects in accordance with said different current magnitude, and evaluating means (200, 300) including first and second threshold defining means for defining first smaller and second larger predetermined threshold values, conductor means operatively connecting said evaluating means to said power supply means through said resistance means for determining said different defects in the form of an insulation breakdown state or in the form of a discontinuity state, or for indicating a normal state of said picked up core as a function of a relative magnitude of said current with respect to said first and second threshold values.

2. The electric testing apparatus of claim 1, wherein said evaluating means comprises means (209, 219, 303, 305) for determining that said picked up core is normal when said current is larger than said first predetermined threshold value and smaller than said second predetermined threshold value which is larger than said first predetermined threshold value, whereby a current representing a normal state falls between said two threshold values.

3. The electric testing apparatus of claim 2, wherein said evaluating means comprises first determining means (209, 303, 321) for determining that said picked up core is in a discontinuity state when said current is smaller than said first predetermined threshold value.

4. The electric testing apparatus of claim 2 or 3, wherein said evaluating means comprises second determining means (219, 305, 327, 329) for determining that an insulation breakdown has occurred between said picked up core and any other cores when said current is larger than said second predetermined threshold value.

5. The electric testing apparatus of claim 1, wherein said pick-up and transferring means comprises a movable member (51) having at least one notch (53) to be moved along a predetermined moving path, whereby one core is received in said notch when said plurality of cores at said one end are pressed against said movable member and said one core is picked up and moved along said moving path as said movable member is moved.

6. The electric testing apparatus of claim 5, which further comprises
time period defining means (311) for defining a time period for determination by said evaluating means in association with the movement of said movable member (51).

7. The electric testing apparatus of claim 3, further comprising timer means (317) for providing a timer signal after the lapse of a predetermined time period after power has been supplied to the conductor wire of said picked up core, and activating means (321) responsive to said timer signal from said timer means for rendering effective the output of said first determining means (303).

8. The electric testing apparatus of claim 1 or 2 or 3 or 5 or 6 or 7, further comprising means (307, 311, 329, 313, 325) for conditioning the presence of a core pick-up detected output signal in response to a determination by said determining means.

9. The electric testing apparatus of claim 2, wherein said determining means comprises at least one resistor bridge circuit (209, 219) including in one side a resistance equivalent to said resistance means in said current flow path.

10. The electric testing apparatus of claim 1, wherein said resistance means operatively coupled to said second connecting means comprises a vessel and a conductive liquid contained in said vessel and having a predetermined resistivity, and wherein said conductor wires of said cores are collectively immersed in said conductive liquid at said other end thereof, whereby said predetermined value of resistance determinable by said predetermined resistivity is interposed among said conductor wires of said cores.

11. The electric testing apparatus of claim 10, wherein said first connecting means is connected to a reference potential, and wherein said vessel comprises a conductive material of given resistivity connected to said reference potential.

12. The electric testing apparatus of claim 4, further comprising means (307, 311, 329, 313, 325) for conditioning the presence of a core pick-up detected output signal in response to a determination by said determining means.

* * * * *